United States Patent [19]

Donaldson et al.

[11] Patent Number: 5,339,062
[45] Date of Patent: Aug. 16, 1994

[54] HIGH POWER ENERGY TRANSFER SYSTEM UTILIZING HIGH TEMPERATURE SUPERCONDUCTORS

[75] Inventors: William R. Donaldson, Pittsford; Deepnarayan Gupta; Alan M. Kadin, both of Rochester, all of N.Y.

[73] Assignee: The University of Rochester, Rochester, N.Y.

[21] Appl. No.: 88,936

[22] Filed: Jul. 8, 1993

[51] Int. Cl.[5] .................. H01F 1/00; H01F 36/00; H03K 3/38
[52] U.S. Cl. .................. 505/211; 336/DIG. 1; 323/360; 307/306; 361/141; 505/705; 335/216
[58] Field of Search .................. 335/216; 336/DIG. 1; 361/19, 141; 307/277, 306; 323/360; 365/161

[56] References Cited

U.S. PATENT DOCUMENTS

| | | | |
|---|---|---|---|
| 2,914,735 | 11/1959 | Young | 332/51 |
| 3,094,628 | 6/1963 | Jiu | 307/88.5 |
| 3,263,149 | 7/1966 | Meiklejohn | 323/360 |
| 3,277,322 | 10/1966 | Berlincourt . | |
| 3,281,799 | 10/1966 | Van Lint | 323/360 |
| 3,292,021 | 12/1966 | Hoag | 310/10 |
| 3,859,566 | 1/1975 | Gassong | 317/13 D |
| 3,956,727 | 5/1976 | Wolf | 338/32 |
| 4,020,412 | 4/1977 | Rioux | 323/43.5 R |
| 4,074,343 | 2/1978 | Chaussy et al. | 363/14 |
| 4,370,568 | 1/1983 | Lumley | 307/260 |
| 4,414,461 | 11/1983 | Wolf | 219/121 |
| 4,967,141 | 10/1990 | Kiguchi et al. | 323/360 |

FOREIGN PATENT DOCUMENTS

| | | | |
|---|---|---|---|
| 0196804 | 8/1989 | Japan | 335/216 |
| 1736016 | 5/1992 | U.S.S.R. | 335/216 |

OTHER PUBLICATIONS

A. N. Kadin, et al, Physica B165 & 166 (1990) 1507–1508.
P. Scharnhorst, Physical Review B, vol. I, No. 11 Jun. 1, 1970.
J. H. Classen, et al, Rev. Sci. Instrum., 62 (4), Apr. 1991, pp. 996–1004.
A. Frenkel, et al, J. Appl. Phys., 67 (6) Mar. 15, 1990.
H. P. Kwok, et al, Appl. Phys. Lett., vol. 54, No. 24, Jun. 12, 1989 pp. 2473–2475.
P. H. Balletine, IEEE Trans. Magn. vol. 25-2, pp. 950–953, Mar 1989.
T. Burke, et al, "Analysis of Current Multiplication Circuit". . . (PIE) 1992.

*Primary Examiner*—Leo P. Picard
*Assistant Examiner*—Stephen T. Ryan
*Attorney, Agent, or Firm*—M. Lukacher

[57] ABSTRACT

Electrical energy is transferred or switched by selectively holding off the coupling of a magnetic field to a secondary inductive element (a coil) through a path which contains a high temperature superconductive element (HTS) which is capable of holding off the field when in its superconductive state notwithstanding that it is a high energy magnetic field. The HTS operates to hold off the magnetic field in accordance with the flux exclusion effect. When the HTS element is driven normal by heating with a laser pulse, the flux passes through the element and couples the field to the secondary, which may be connected to a load. A primary coil of superconducting material around the secondary coil can provide superconducting magnetic energy storage. The primary field is held off by HTS elements in the flux path to opposite ends of the secondary coil. These elements may be driven normal by laser pulses to transfer the stored magnetic energy to a load. A plurality of secondary coils, each with associated HTS elements, may be selectively coupled to the load as programmed inductive elements (PIE).

20 Claims, 5 Drawing Sheets

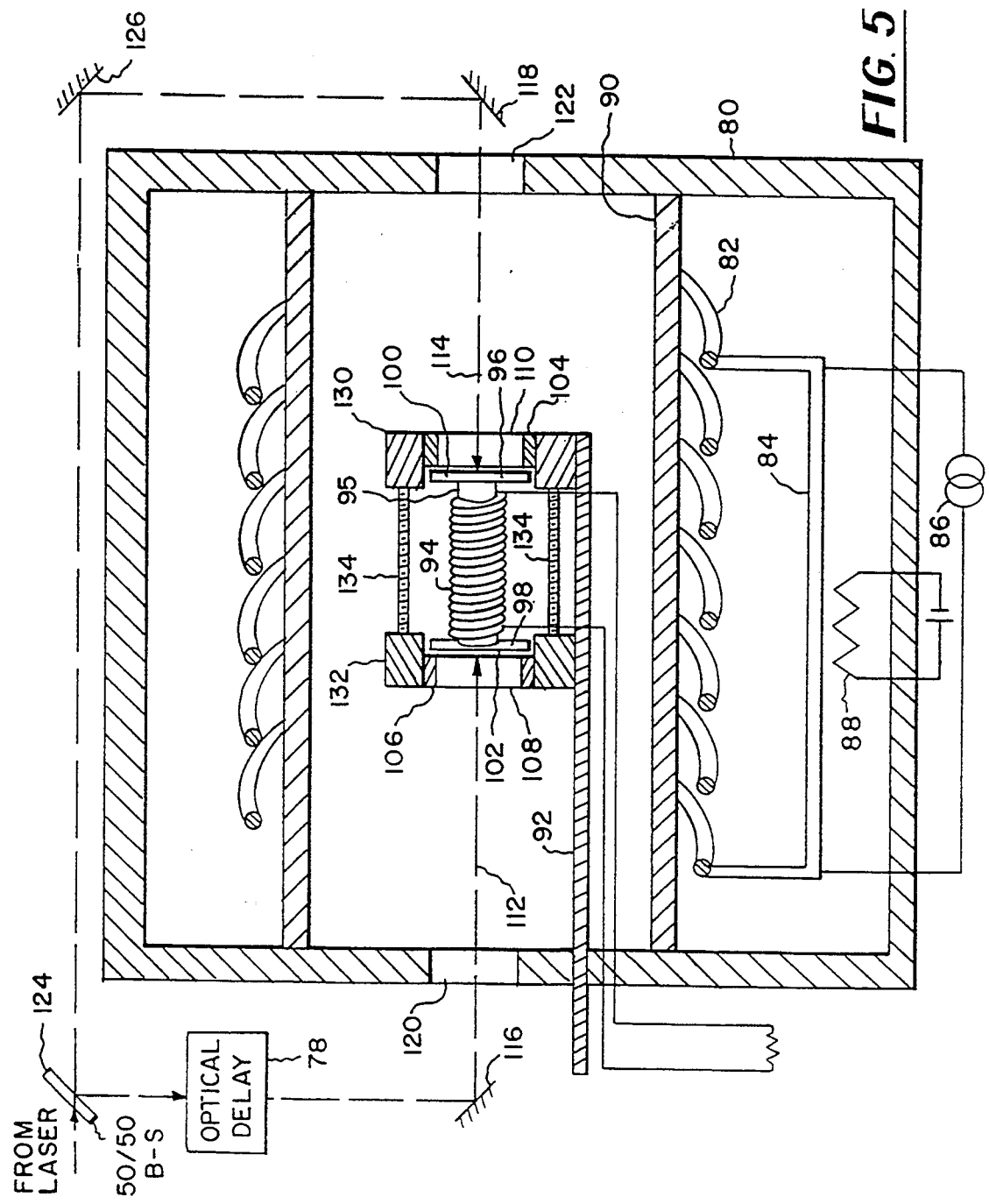

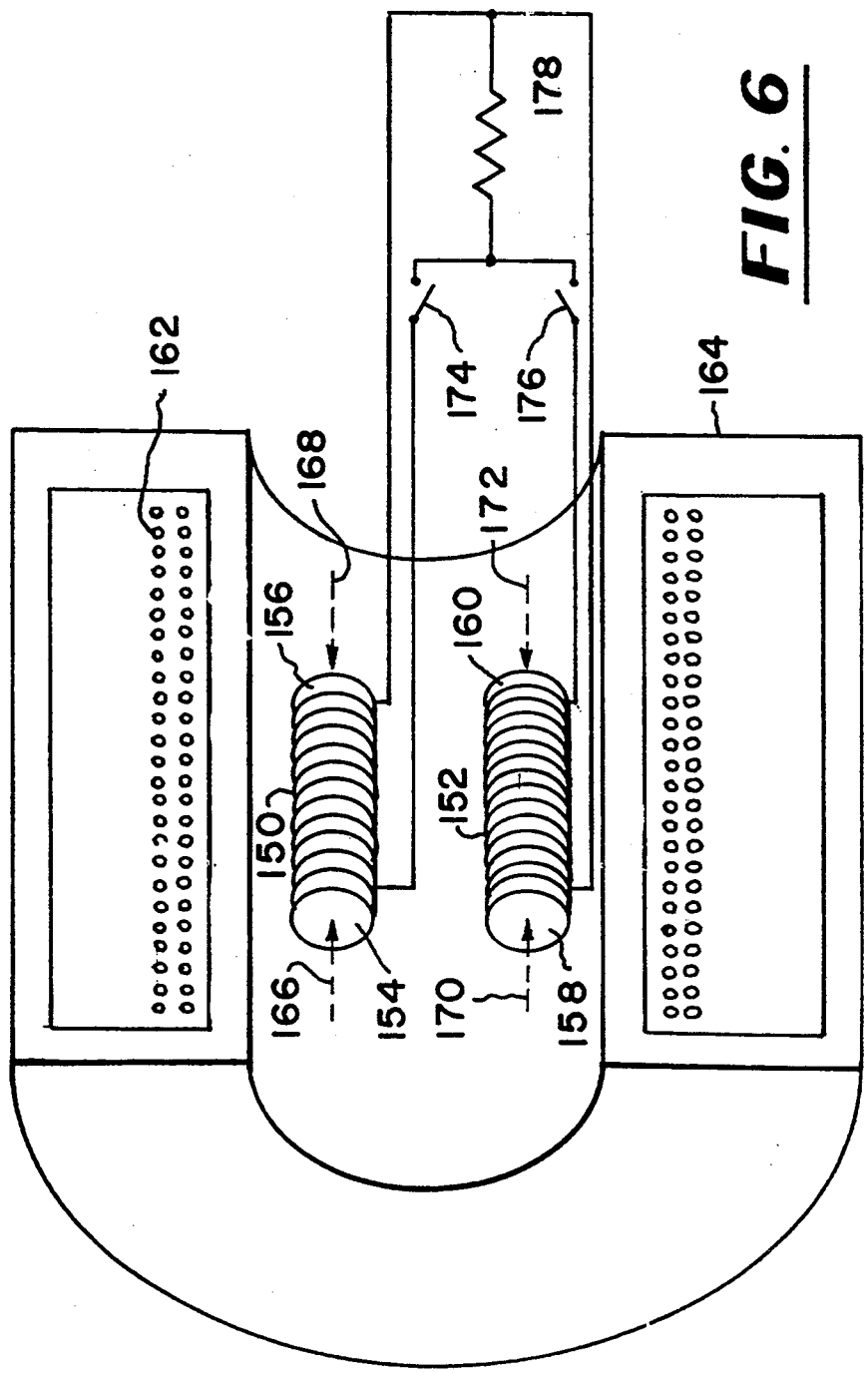

HIGH POWER ENERGY TRANSFER SYSTEM UTILIZING HIGH TEMPERATURE SUPERCONDUCTORS

DESCRIPTION

The U.S. Government has rights in this invention pursuant to Grant DMR 8913524 from the National Science Foundation to the University of Rochester.

The present invention relates to systems for high power energy transfer and storage, utilizing high temperature superconductors, and more particularly to methods and apparatus for controlling inductive coupling between primary and secondary coils with a high temperature superconductor (HTS) element, which acts as a shield when in the superconductive state, even when it is in a high energy magnetic field which tends to drive the element normal. The HTS element is driven normal, selectively when triggered by a laser pulse to enable the magnetic field to be inductively coupled to the secondary coil to which the energy is then transferred.

The invention is especially suitable for use in a system for superconducting magnetic energy storage (SMES) wherein the high energy magnetic field is due to energy stored in a superconducting magnet coil. The field from the magnet coil is selectively coupled to an output coil when an HTS element is changed from a superconductive to a normal state by laser pulse actuation. Other applications for the invention may be found wherever it is desirable to control the transfer of electrical energy at high energy levels, for example, from about 100 joules per cubic meter to 10 mega-Joules per cubic meter. For example, in order to prevent the quench of superconductive magnets by detecting voltage increase across the magnets thereof, upon which a laser or other optical trigger is actuated to dump the energy in the superconductive magnet before meltdown occurs therein, and also in fault limiters in power transmission systems wherein a coil which inductively couples the transmission system to an auxiliary load is isolated by a superconductive HTS element which is optically triggered and changed to its normal state upon detection of a fault, as when the load on the power transmission system disappears, so as to reflect the impedance of the auxiliary load through the transformer provided by the coils or to dump the high power energy into the auxiliary load. The fault is sensed and causes a laser pulse to be generated, which changes the HTS element to its normal state.

Transfer or switching of electrical energy at high energy levels with superconductive materials has heretofore not been accomplished, since the magnetic fields are so intense that they tend to drive the superconductive material normal (non-superconducting). Thus, superconductive materials have been considered only for low power applications as in digital data storage elements or logic devices. See U.S. Pat. No. 2,914,735 issued Nov. 24, 1959 to D. R. Young. Such devices are also incapable of handling high energy transfer to inductive elements by failing to provide sufficient time for the transfer of the energy, considering the inductive reactance of the output element and the load connected thereto. Photoresistive and magnetoresistive effects have been used to render part of a superconductive coil normal, thereby increasing its resistance and permitting inductive coupling thereto. Such devices are subject to ohmic heating which precludes their use in transferring energy at high levels. By high level energy is meant energy in the range from about 100 Joules per cubic meter to 10 mega-Joules per cubic meter and magnetic fields of the order of 1–10 Tesla in intensity.

Accordingly it is the principal object of the present invention to provide improved systems (methods and apparatus) for the controlled transfer of electrical energy at high energy levels, utilizing superconductors as the control element.

More specifically, it is an object of the present invention to provide an improved system for controlled inductive coupling or switching of magnetically stored energy, which may be at high energy levels, by inductive coupling through a volume containing a superconductive element.

It is a still further object of the present invention to provide improved systems for superconducting magnetic energy storage (SMES).

Briefly described, a system for transferring electrical energy at high energy levels, utilizes energy which is stored in a primary magnetic field. Such storage may be provided by a primary coil through which current passes, or with other electromagnetic or permanent magnet devices. The field is isolated from a secondary inductive element or coil with a superconductive shielding member of a material which remains in a superconductive state in the presence of a magnetic field containing energy in the range which is being handled. Such an element is preferably a high temperature superconductor, which may be in the form of a thin film (0.2 to 1.0 microns thick) of material such as $YBa_2Cu_3O_7$ (YBCO). The shielding member is heated, preferably with a laser pulse, to drive it normal for a period of time sufficient to transfer the energy in the primary field to the secondary element, and to an electrical load connected thereto. This secondary element need not be of superconductive material. However, the primary element may be a superconducting coil. Then a SMES system is provided. In order to provide programmed transfer of energy to the output load, a plurality of secondary elements may be used, each shielded by an associated superconductive shielding member or members. Then each superconductive member may be driven normal selectively and in programmed sequence through switches which are also programmed in order to provide programmed inductive elements (PIE) for controlling the rate at which the energy is transferred to the load. The heating of the shielding member is carried out with a laser pulse. The member is disposed in a cryostat so that upon heating, it remains normal for the requisite period of time to transfer the energy, considering the time constant of the inductive elements and the load (L/R), where L is the inductance appearing across the secondary inductive element and R is the resistance of the load.

The foregoing and other objects, features and advantages of the invention will become more apparent from a reading of the following description in connection with the accompanying drawings in which:

FIG. 5 is a schematic diagram of an SMES system embodying the invention; and

FIG. 6 is a schematic diagram of an SMES system in accordance with another embodiment of the invention.

Figure 1:
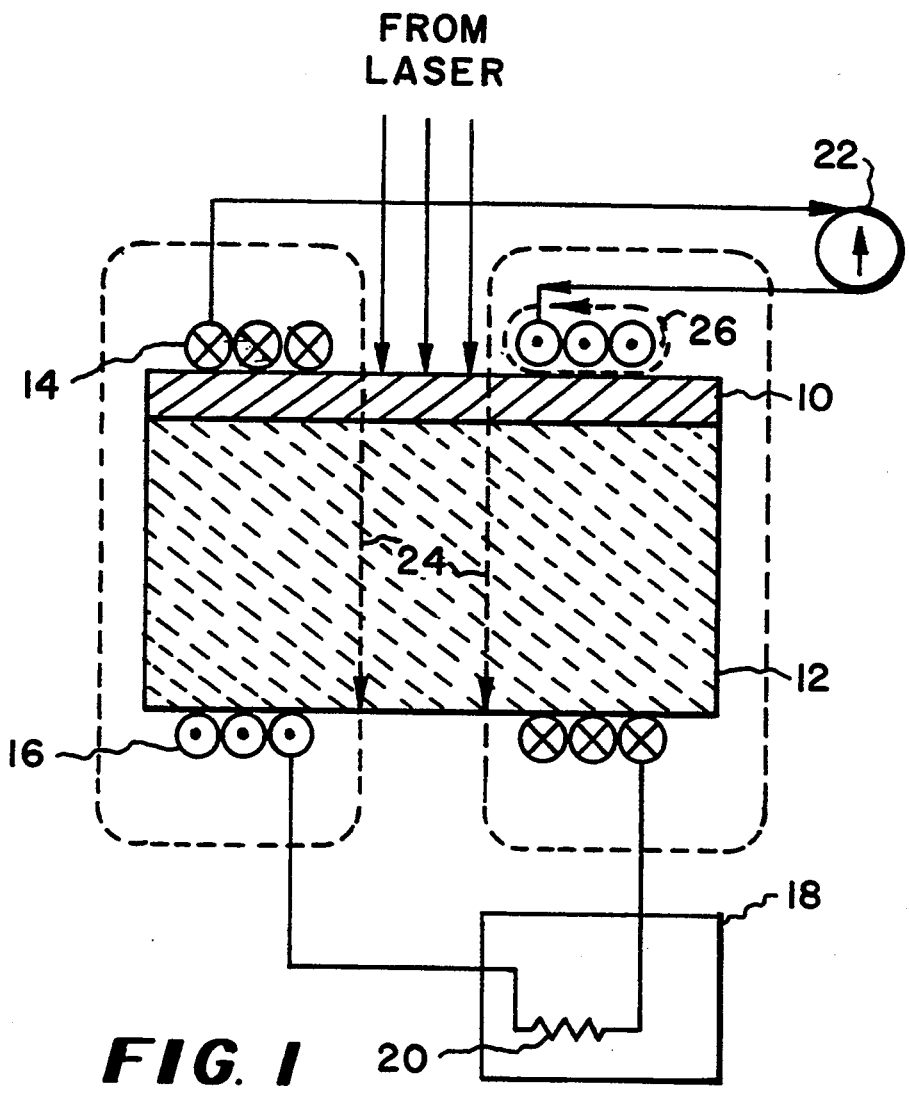
FIG. 1 is a simplified, schematic diagram illustrating the principles of operation of a system embodying the invention.

Referring to FIG. 1 there is shown schematically, to illustrate the principle of the invention, an inductively coupled electrical energy transfer or switching system. The apparatus for cooling to low temperatures, for example 90° Kelvin (K) needed to bring the superconductor element which superconducting state is not shown to simplify the illustration. The superconductive element is a HTS thin film 10 of from 0.2 to 1.0 microns (preferably 0.8 microns) thick which is deposited on a insulating substrate 12, for example a ceramic such as MgO, LaAlO$_3$, SrTiO$_3$ or yttria or stabilized ZrO$_2$. Fabrication of such films is described in an article by P. H. Ballentine which appeared in IEEE Trans. Magn., Vol. 25-2, pp. 950–953 (1989).

Figure 4:
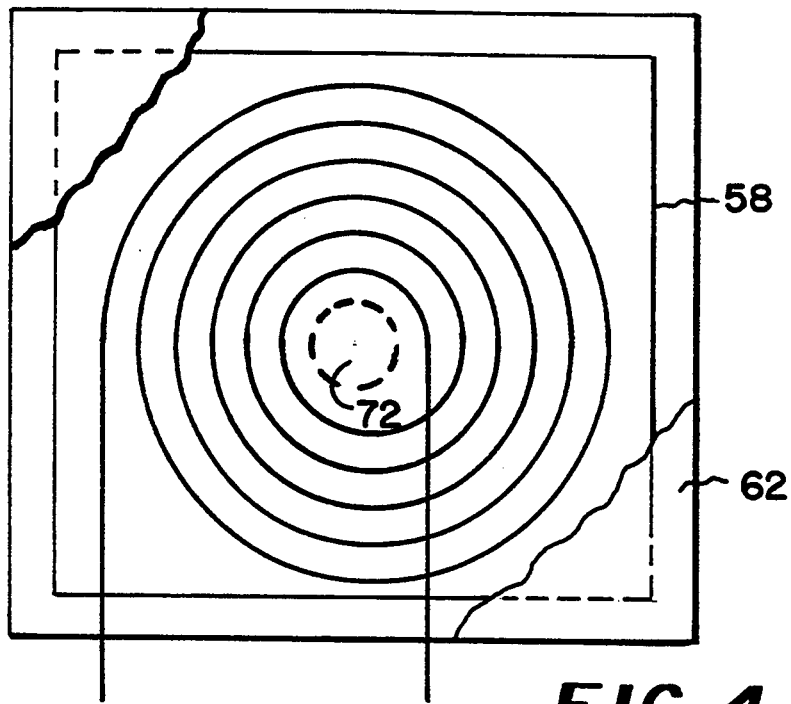
FIG. 4 is a sectional view along the line 4—4 in FIG. 3.
Figure 3:
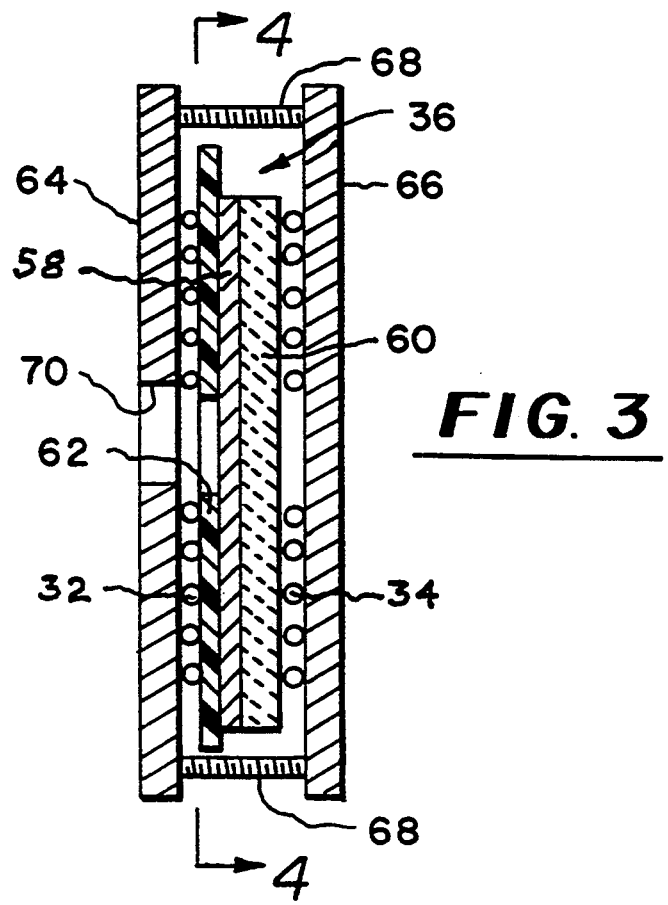
FIG. 3 is a side view of the assembly, including the superconductor element, which is used in the system shown in FIG. 2.

A primary magnetic field is generated by a primary inductive element in the form of a spiral or pancake coil 14. This coil is butted against the HTS film 10. Preferably, an insulating material is interposed between the coil 14 and the film 10 to prevent scratching or other damage thereto. Such a protective sheet in the form of a polytetrafluoroethylene (Teflon) sheet is shown in FIGS. 3 and 4.

A secondary inductive element in the form of another spiral or pancake coil 16 is disposed in abutting relationship with the substrate 12 on the side thereof opposite to the film 10. This coil is shown as being connected to a load 18 represented by a resistor 20.

A laser pulse, for example from a Nd:YAG laser produces an optical pulse in order to change the state of the HTS film 10. This pulse may be 150 to 170 ps in duration. For test purposes or for repetitive switching, the optical pulses may be applied repetitively, e.g. at a 1 kHz rate. The response of the system depends upon the initial temperature of the HTS film 10, the current through the coil 14 and the incident laser fluence (illumination). There is a delay with respect to the optical pulse or optical trigger which depends upon the laser fluence. With coils 14 and 16 having 100 turns and approximately 50 microhenries ($\mu$H), and with a 50 ohm resistor 20, the rise time is approximately 4 ns and the delay with respect to the optical (laser) trigger pulse is from 20 to 100 ns. When the primary field is provided by a current pulse, this pulse is much longer in duration than the laser pulse and the laser pulse occurs within the duration of the electrical current pulse applied to the primary coil 14. A current source 22 provides the current to the primary coil. A pulse current in the primary 14 may be used to avoid heating of the film 10 due to the IR losses in the coil 14. A DC current may be used or even AC current. The HTS film is disposed in the path 24 of the flux from the primary. However, that path is blocked and the flux is retained on one side of the film as shown at 26 when the HTS film is in its superconducting state.

In the superconducting state of the film 10, flux is completely expelled from the bulk of the superconductor 10 (Meissner effect) and the film 10 provides a magnetic screen or shield between the coils 14, which when the film is normal, are inductively coupled and form a transformer. The presence of the superconducting flux screen prevents flux coupling between the coils 14 and 16 and no voltage is induced in the secondary coil 16.

Under illumination by the short optical pulse, the HTS film 10 changes (makes a transition) to the normal state primarily from the thermal effect or heating of the Laser pulse and the flux is coupled to the secondary coil 16; allowing complete energy transfer before the HTS film 10 recovers to a superconducting state.

The inductance appearing across the secondary and the resistance determines the time constant (L/R) during which the HTS film 10 remains normal, thereby enabling the transfer of the energy from the primary to the secondary. This transfer results in an induced voltage proportional to the rate of change of the flux in the secondary.

The HTS film is capable of holding off high energy levels in the 100 to 10 mega-Joule per cubic meter range. The fields in such range may be of the order of 1–10 Tesla. The HTS film will not break down the flux exclusion effect in the presence of such fields. The laser pulse heats the HTS film 10 so that it drops back to its normal state. When the optical pulse is removed, because of the thermal transfer coefficients, heat capacities and thermal conductivities involved, the HTS film 10 remains normal until all of the energy is transferred from the primary to the secondary coil. This enables electrical energy at high levels to be transferred under conditions controlled by the laser and the HTS film.

The output voltage may be controlled by varying the number of turns in the secondary coil 16. High output voltages and high currents, for example 20 kV, approximately 5 kA may be handled.

The current pulses may result from a voltage pulse which is applied to the primary coil. This voltage pulse and the laser pulse are in time coincidence, the laser pulse being much shorter than and contained within the duration of the voltage pulse.

Figure 2:
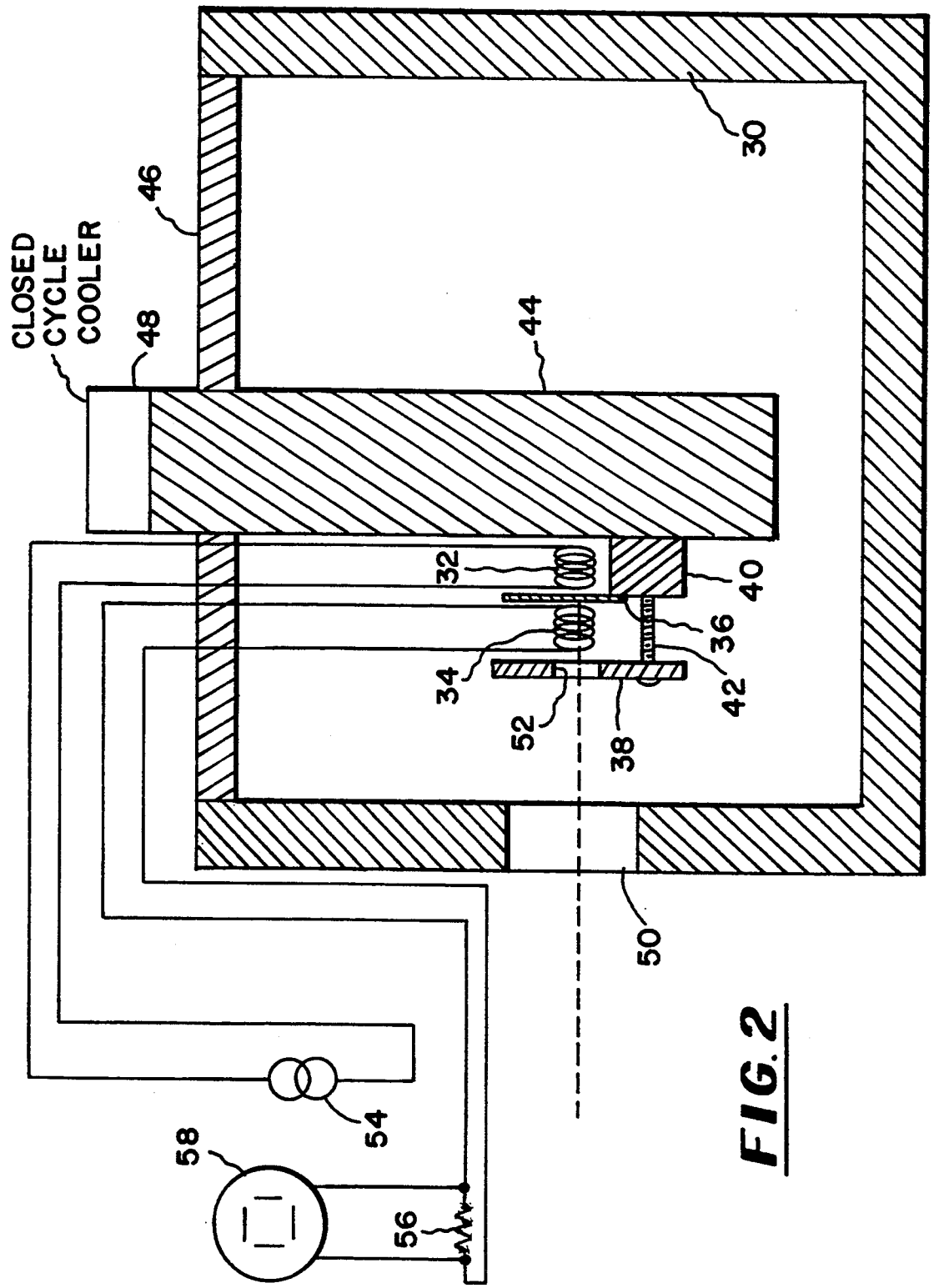
FIG. 2 is a schematic diagram illustrating the system in greater detail.

Referring to FIG. 2 there is shown a closed vacuum cryostat 30. An assembly of a primary coil 32 and a secondary coil 34 disposed in abutting relationship with a HTS film on a substrate 36 is used. These coils, like the coils 14 and 16 may be copper coils. The assembly further includes at least one clamping plate 38 and backing blocks 40 which enable the coils to be held firmly in abutting relationship against the HTS thin film and substrate 36. While only one clamping plate 38 and backing block 40 is shown, it will be appreciated that at least one additional backing block 40 and clamping plate is desirably used. The plate 38 and blocks 40 are clamped together with the aid of clamping screws 42. The assembly which is clamped together is disposed in supported relationship and in thermal contact with a copper cold finger 44. This cold finger is supported on a top plate 46 of the cryostat 30. The cold finger is heated to a temperature between 60° and 100° Kelvin by a closed cycled cooler 48.

An optical window 50 in a wall of the cryostat 30 and a hole 52 in the clamping plate 38 provide access for the laser pulse which may be a 1.064 micron pulse of 170 ps duration from an Nd:YAG laser.

The coils may be freestanding coils which are wound on a form and covered by a plastic material, such as epoxy to hold the turns of the coils in place. Alternatively, the coils may be wound on insulating tubes. The assembly and connection to the cold finger provides a rigid structure which is capable of withstanding the magnetic forces which are generated when current, say from a current source 54, is applied to the primary coil 32, and tend to compress the coil assembly. These may be DC pulses or AC electrical current, The laser pulse is preferably synchronized with the pulses when a pulse source 54 is used. DC may also be passed continuously through the primary coil 32. The secondary 34 is connected across a load resistor 56. An oscilloscope 58 for measuring the wave shape of the signal coupled to the load 56 is illustrated. The oscilloscope can then display the rise time and duration of the output pulse when the HTS film 36 is rendered normal. The thermal characteristics of the apparatus provides for the extraction of substantially all of the energy which is in the primary 32. The primary and secondary, 32 and 34, may be reversed if desired.

Referring to FIGS. 3 and 4 there is shown presently preferred embodiments of the coil and HTS assembly. The HTS assembly 36 may be a YBCO thin film, suitably of 0.8 microns thickness uniformly deposited on a substrate 60 of, for example MgO or lanthanum aluminate (ceramics). The film 58 is protected by a Teflon sheet 62. The coils are spiral, pancake coils of copper wire which are clamped between copper clamping plates 64 and 66 which are held together by clamping screws 68. The wire may be insulated wire, such as commercially available 38 or 40 gauge copper wire covered by varnish insulation. The laser pulse beam passes through an access hole 70 in one of the clamping plates 64 and irradiates a region 72. In order to make the flux through the region 72 more uniform, it may desirable to photolithographically form indentations in the thin film 58. The use of such indentations is optional and may be avoided if they contribute to magnetic leakage, when the film 58 is in its superconductive state. The back clamping plate 66 is connected to the copper cold finger 44 (FIG. 2).

Referring to FIG. 5 there is shown an outer cryostat 80 containing a liquid helium bath. A coil 82 of superconducting metallic material such as niobium-titanium or niobium-tin alloy is contained in the bath. Opposite ends of the coil are connected through a shunt 84 of the same material as the coil 82. A DC charging current source 86 is connected across the end of the coil 40 through a switch (not shown). A switched persistence heater 88 heats the shunt to render it normal during charging. Then the superconducting coil is charged by circulating a current, for example of the order of 100 Amps. The heater 88 is then turned off and the current continues to circulate through the coil. The coil 82 is then a superconductive magnet, charged to a high energy level.

An inner cryostat 90 is provided by a vacuum enclosure into which a copper, liquid nitrogen cooled cold finger 92 extends. The cold finger is made of inner and outer tubes through which liquid nitrogen is circulated. The cold finger also provides a structural support by being anchored to the outer wall of the inner cryostat.

A secondary coil 94 which may be a copper coil is wound on an insulating rod 95, such as an $Al_2O_3$ rod, which is clamped between plates of ceramic material such as MgO 96 and 98. HTS superconductive thin films 100 and 102 are deposited on the plates 96 and 98, respectively. These plates are in abutting relationship with the opposite ends of the rod 95 on which the secondary coil 94 is wound. Blocks 104 and 106 of copper having apertures 108 and 110 through the blocks provide passageways for laser pulse beams 112 and 114 which are generated by a laser, such as an Nd:YAG laser (not shown). The beams 112 and 114 are directed by folding mirrors 116 and 118 through windows 120 and 122 in the walls of the inner cryostat to be incident on the HTS films at opposite ends of the secondary coil. The laser beam is applied simultaneously to the HTS films 100 and 102 by an optical system including the folding mirrors 116 and 118, a 50/50 thin film dielectric beam splitter 124, another folding mirror 126 and an optical delay 78. The optical delay includes additional folding mirrors so spaced that pulses from the laser are applied simultaneously to the films 100 and 102.

The secondary coil assembly is connected to the cold finger 92 by support blocks 130 and 132 having apertures in which the blocks 104 and 106 are disposed. Clamping screws 134 hold the blocks 130 and 132 together. The aperture blocks 104 and 106 are then brought into contact with the HTS thin film elements 100 and 102 and their substrates are clamped against the opposite ends of the rod 95 on which the secondary coil 94 is wound. The entire assembly is mechanically rigid and sustains compressive forces due to the magnetic field from the superconducting coil 82.

The secondary coil is disposed within, and is preferably coaxial with, the superconducting coil 82. The secondary coil is connected to a load which may be a resistor and may include capacitors on which the energy transferred from the superconducting coil 82 to the secondary coil 94 is stored. These capacitors develop a DC voltage which may be converted to AC at a frequency compatible with the public utility power lines. The energy stored in the superconducting coil may then be dumped into the load, or the energy may be transferred to the power lines, after conversion to AC power. Such transfer may be used in application where the demand for power from the power lines is temporarily increased, thereby avoiding the need for additional generating capacity in the public utility generating system. The system of FIG. 5 thus provides a superconducting magnetic energy storage system (commonly called an SMES system), Referring to FIG. 6, there is shown schematically a SMES system where the secondary coils are operative as programmed inductive elements (PIE). A pair of secondary coils 150 and 152 have HTS thin film shielding members, 154 and 156 at the opposite ends of the coil 150 and shielding members 158 and 160 at the opposite ends of the coil 152. These coils and shielding members may be supported in assemblies in one or more cold finger supports in an inner cryostat as described in connection with FIG. 5, but not shown in FIG. 6 to simplify the illustration. A superconducting magnet 162 is disposed in an outer cryostat 164. The laser pulses in beams 166 and 168 are applied simultaneously to the HTS shield members 154 and 156 when the secondary coil 150 is to be inductively coupled to the superconducting magnet. The laser pulses from beams 170 and 172 are simultaneously applied to the HTS shield members 158 and 160 when the other secondary coil 152 is to be inductively coupled to the superconducting magnet coil 162. Then closing switches 174 and 176, which may be disposed externally of the cryostats, ere closed in synchronism with the laser pulses applied to the HTS shield members of the secondary coils to which they are connected. The energy is transferred to a load 178 in programmed timed sequence as required to service the load. The load may contain a resistor and capacitive elements for providing a DC current which is converted to AC and applied to the public utility power lines to compensate and meet high load demand conditions. While two secondary coils are shown, it will be appreciated that more coils may be used so as to enable relatively small coils and small HTS shielding members to transfer the energy stored in the superconducting magnet. In typical applications, the superconducting magnet coil 162 in FIG. 5 may be one meter in diameter while the secondary coil assemblies in FIG. 6 may be about 5 cm in diameter. Accordingly, the energy may be transferred with elements capable of holding off the magnetic field at each of the secondary coils and enabling relatively small coils to be used.

From the foregoing description, it will be apparent that there has been provided high power electrical energy transfer systems using high temperature superconductors. Variations and modifications of the herein described systems and applications therefore in addition to and other than those mentioned herein will become apparent to those skilled in the art. Accordingly, the foregoing description should be taken as illustrative and not in a limiting sense.

We claim:

1. A method of transferring electrical energy in a range of at least 100 Joules per cubic meter which comprises the steps of:

storing said energy of a least 100 Joules per cubic meter;

isolating said field from a secondary inductive element with a superconductive shielding member of material which remains in a superconductive state in the presence of a magnetic field containing energy in said range; and heating said shielding member to drive it normal for a period of time sufficient to transfer the energy in said primary field to said secondary element and an electrical load connected thereto, said heating step being carried out with a laser pulse incident on said shield member, said period of time being at least equal to L/R where L is the inductance presented by said secondary element and R is the resistance of said load.

2. The method according to claim 1 wherein the transfer of said energy to said secondary element is carried out by the step of inductively coupling said secondary element to said primary field when said shielding member is driven normal during said heating step.

3. The method according to claim 1 wherein said storing step is carried out by charging a primary inductive element.

4. The method according to claim 3 wherein said charging step includes the step of passing electrical current through a superconductive coil which provides said primary element.

5. The method according to claim 1 wherein said isolating step is carried out by placing a sheet of high temperature superconductive material in the path for magnetic flux linking said primary and secondary elements and inductively coupling said elements to each other.

6. The method according to claim 5 wherein said high temperature superconducting material is a film of ceramic material providing said sheet and being from about 0.2 micron to about 1 micron in thickness.

7. The method according to claim 6 wherein said ceramic material is YBCO.

8. A method of transferring electrical energy in a range of at least 100 Joules per cubic meter which comprises the steps of:

storing said energy of at least 100 Joules per cubic meter in a primary magnetic field;

isolating said field from a secondary inductive element with a superconductive shielding member of material which remains in a superconductive state in the presence of a magnetic field containing energy in said range; and heating said shielding member to drive it normal for a period of time sufficient to transfer the energy in said primary field to said secondary element and an electrical load connected thereto, being carried out with a laser pulse incident on said shielding member.

9. The method according to claim 8 wherein said storing step is carried out by applying a voltage to a primary inductive element to produce a current therein.

10. The method according to claim 9 wherein said voltage is a pulse of duration longer than said laser pulse.

11. The method according to claim 10 further comprising the step of timing said voltage and laser pulses so that said laser pulse occurs within the duration of said voltage pulse.

12. High power electrical energy transfer apparatus which comprises:

a primary coil and a secondary coil disposed in inductively coupled relationship, said secondary coil being connected to an electrical load;

means for passing electrical current through said primary coil to provide a field linking said primary and secondary coils and containing electrical energy in a range of at least 100 Joules per cubic meter;

a member disposed between said coils and in said linking field, which when in a superconductive state, holds off said linking field without being driven into a normal state; and heating means for changing the state of said member from superconductive to normal state for a period of time sufficient to transfer said energy from said primary coil to said secondary coil, said heating means comprises a laser pulse incident on said shielding member, said period of time being approximately the time constant L/R presented by said secondary and said load, where L is the inductance appearing across said secondary and R is the resistance of said load.

13. The apparatus according to claim 12 further comprising a plurality of secondary coils wherein at least one of said secondary coils and said member are disposed in a cryostat, cooled to a temperature sufficient to drive said member to its superconductive state, and a window in said cryostat for said laser pulse, which window and pulse comprise said state changing means.

14. The apparatus according to claim 13, wherein each of said secondary coils is magnetically coupled to said primary coil, and wherein a plurality of said members is provided, a different member being associated with a different one of said secondary coils for holding off said linking field thereto, and said state changing means including means for changing the state of each of said members individually.

15. The apparatus according to claim 14 further comprising means for selectively connecting said secondary coils to a load.

16. The apparatus according to claim 12 wherein said secondary coil has opposite ends, said primary coil being disposed around said secondary coil so that said linking magnetic field extends between the opposite ends of said secondary coil, said member being provided by a pair of members in said linking field to the opposite ends of said secondary coil.

17. The apparatus according to claim 16 wherein said state changing means comprises means for directing laser pulses in time coincidence to said pair of members.

18. The apparatus according to claim 14 wherein said state changing means comprises means for providing laser pulses which are incident upon said members.

19. The apparatus according to claim 12 wherein said member is a film from about 0.2 micron to about 1 micron in thickness disposed upon a substrate, said secondary coil being in abutting relationship with said substrate.

20. The apparatus according to claim 16 wherein said primary coil is a closed loop of material which is superconducting for storage of the electrical energy, which is transferred to said secondary coil when said member is driven to its normal state.

* * * * *